United States Patent
Nagai et al.

(10) Patent No.: US 6,788,588 B2
(45) Date of Patent: Sep. 7, 2004

(54) ASYNCHRONOUS SEMICONDUCTOR MEMORY DEVICE

(75) Inventors: Kenji Nagai, Kawasaki (JP); Hirokazu Nagashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 10/345,353

(22) Filed: Jan. 16, 2003

(65) Prior Publication Data

US 2003/0174543 A1 Sep. 18, 2003

(30) Foreign Application Priority Data

Mar. 14, 2002 (JP) ........................................ 2002-070988

(51) Int. Cl.$^7$ ................................................ G11C 7/00
(52) U.S. Cl. ............................ 365/189.05; 365/189.07; 365/185.17
(58) Field of Search ....................... 365/189.05, 189.07, 365/185.17

(56) References Cited

U.S. PATENT DOCUMENTS 6,507,529 B2 * 1/2003 Fujimoto et al. ...... 365/189.05
6,725,325 B2 * 4/2004 Nishiyama et al. ..... 365/189.07

FOREIGN PATENT DOCUMENTS

JP          09-167485       6/1997
JP          11-086547       3/1999

* cited by examiner

*Primary Examiner*—Huan Hoang
(74) *Attorney, Agent, or Firm*—Arent Fox, PLLC

(57) ABSTRACT

An asynchronous semiconductor memory device includes an output circuit, which outputs data read from a memory unit, and a high impedance control circuit. The high impedance circuit is connected to the output circuit, stores a burst completion address, and compares a present address with the burst completion address. The high impedance control circuit causes a data output terminal of the output circuit to enter a high impedance state when the present address substantially coincides with the burst completion address. Due to the high impedance control circuit, an exclusive terminal for high impedance control is not necessary.

33 Claims, 7 Drawing Sheets

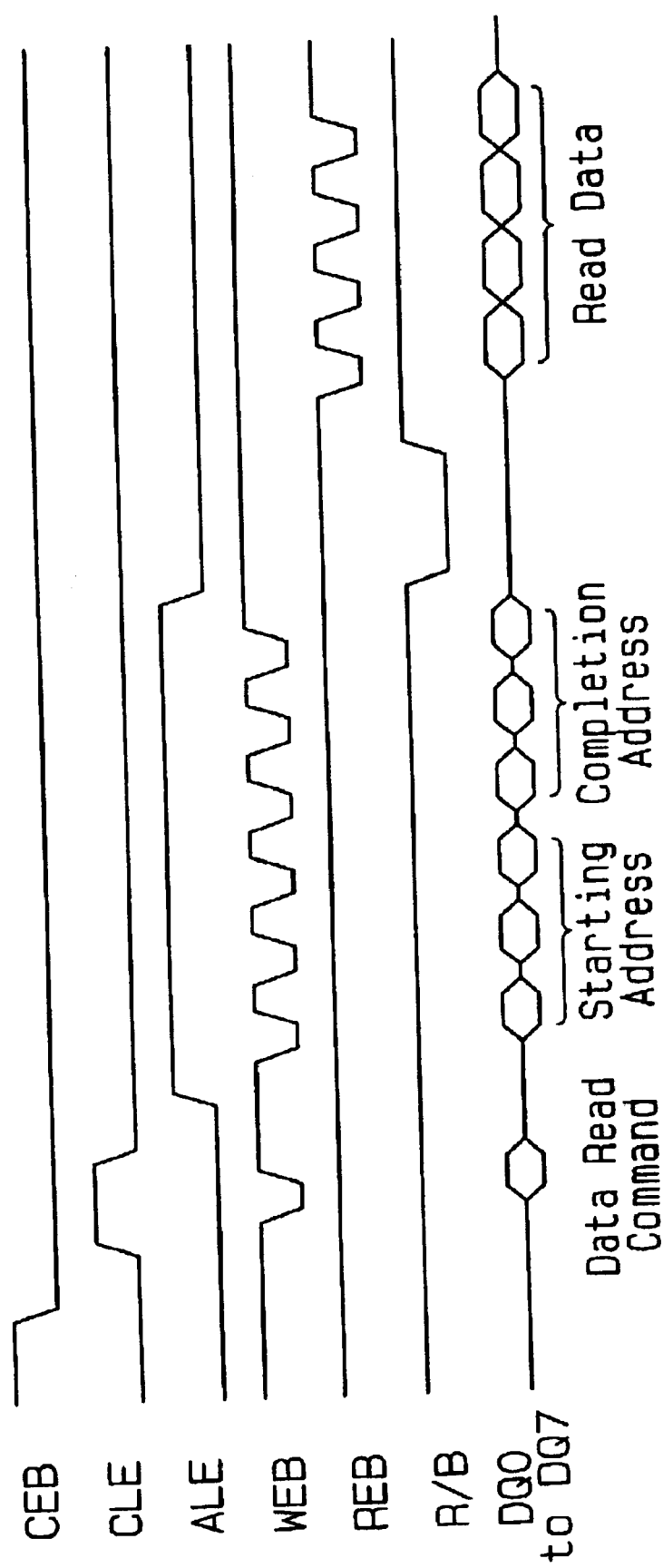

ASYNCHRONOUS SEMICONDUCTOR MEMORY DEVICE

CROSS-REFERENCE TO RELATED APPLICATIONS

This application is based upon and claims the benefit of priority from the prior Japanese Patent Application No. 2002-070988, filed on Mar. 14, 2002, the entire contents of which are incorporated herein by reference.

BACKGROUND OF THE INVENTION

The present invention relates to an asynchronous semiconductor memory device, and more particularly, to the stabilization of data output from an asynchronous semiconductor memory device during high frequency operation.

A flash memory, which is a non-volatile semiconductor memory that enables electrical writing and erasing of data, is used in a portable information terminal, such as a cellular phone. Due to the recent increase in the speed for transmitting and receiving data, the cycle time of a flash memory (i.e., the time from when data is output to the time when data is subsequently output) has been shortened. This has shortened the margin of the time for validating the output of data. The shortened margin results in reading errors. It is thus desired that the occurrence of such reading errors be prevented.

A flash memory is in synchronism with a system clock signal CLK. In the flash memory, the read data output is controlled by a read enable signal REB/ (read enable bar: negative logic). For example, when the duty ratio (the ratio between a high level and a low level) of the read enable signal REB is 50%, the output valid time of the read data is about half of that of the read cycle time.

FIG. 1 is a timing chart illustrating an example of high impedance or disconnecting control (hereafter, referred to as Hi-Z control) in an asynchronous memory. During the Hi-Z control, an output terminal of the memory device is in a disconnected state (Hi-Z state) for an external device.

In response to a trailing edge of the read enable signal REB at time t1, an I/O terminal exits the Hi-Z state. At time t2, read data DQ1 is output. In response to a rising edge of the read enable signal REB at time t3, the I/O terminal is controlled in the Hi-Z state. At time t4, output is disabled.

Accordingly, when the duty ratio of the read enable signal is about 50%, the output valid time of the read data DQ1 (i.e., the period between time t2 to t4) is about half the read cycle time (i.e., the period between time t1 to t5). Read data DQ2 and DQ3 are also output in the same manner as the read data DQ1. When a plurality of memory devices use the same I/O bus (data input and output bus), such Hi-Z control is performed to prevent the occurrence of bus competition (bus fight) between memory devices.

The increase in the speed of the entire memory system (i.e., shifting to higher frequency) due to the high occupying rate of the I/O bus shortens the read cycle time. The shortened read cycle time reduces the margin of the data output valid time. That is, when the cycle time (time t1 to t5) is shortened, it becomes difficult to guarantee the output valid time of the read data DQ1 to DQ3. Thus, the retrieval of the read data DQ1 to DQ3 by the memory controller cannot be guaranteed.

An extended data out (EDO) technique (hyper page mode), which holds the immediately previous data until the next data is provided, has been proposed to solve this problem. FIG. 2 is a schematic block diagram of a prior art extended data out DRAM system (hereinafter, referred to as EDO-DRAM) 60. The DRAM system 60 includes an asynchronous semiconductor device (hereinafter, referred to as memory device) 61 and a memory controller 62, such as a CPU, for controlling the memory device 61.

In response to a trailing edge of the read enable signal REB from the memory controller 62, the memory device 61 provides the memory controller 62 with an I/O signal DQ, which is read data. The I/O signal DQ (read data) is held until the memory device 61 is provided with the next read enable signal REB (trailing edge). The output terminal of the memory device 61 is controlled in a Hi-Z state by the I/O control signal OEB/ (output enable bar: negative logic) from the memory controller 62.

FIG. 3 is a timing chart illustrating the Hi-Z control of the EDO-DRAM system 60. When an I/O control signal OEB is output at a low level, the I/O terminal exits the Hi-Z state in response to the trailing edge of the read enable signal REB at time t1. Read data DQ11 is output at time t2. In response to the trailing edge of the read enable signal REB at time t3, the read data DQ11 is held until the output of the next read data DQ12 starts at time t4. In the same manner, in response to the trailing edge of the read enable signal REB at time t5, the read data DQ12 is held until the output of the next read data DQ13 starts at time t6. After the read data DQ13 is output, the I/O terminal is controlled in a Hi-Z state in response to the rising edge of the I/O control signal OEB at time t7. At time t8, the read output is disabled.

In the EDO-DRAM system 60, the read data DQ11 to DQ13 is output substantially during the read cycle time (time t1 to t3). Accordingly, the output valid time of the read data DQ11 to DQ13 is guaranteed even if the increase in the speed of the memory system (i.e., shifting to high frequency) shortens the cycle time.

To cope with the demand for memories having higher capacities and lower power consumption, NAND flash memories are now used in portable information terminals, such as cellular phones. However, when employing the EDO technique for a NAND flash memory, to use the I/O control signal OEB for Hi-Z control, an exclusive terminal for the I/O control signal OEB becomes necessary. Such addition of the Hi-Z control exclusive terminal increases the number of internal control circuits in the memory device and increases the circuit area of the memory. Further, the number of control signals used by the memory controller and the memory system increases. This affects the other user circuits laid out on the same semiconductor substrate. The Hi-Z control exclusive terminal is necessary for the following reason.

The EDO technique is also applied to a synchronous memory system, such as a SDRAM. In a synchronous memory system, the Hi-Z control is performed in synchronism with a system clock signal. Accordingly, a Hi-Z control exclusive terminal is not necessary in the synchronous memory system. An SDRAM employing the EDO technique will now be discussed.

FIG. 4 is a schematic block diagram of an SDRAM 70. The SDRAM system 70 includes a synchronous semiconductor memory device 71 and a memory controller 72, such as a CPU, for controlling the memory device 71. The memory controller 72 provides the memory device 71 with a system clock signal CLK and a command control signal CMD. When the memory device 71 receives the command control signal CMD (read command) from the memory controller 72, the memory device 71 outputs an I/O signal DQ (read data) having a predetermined burst length in response to (in synchronism with) the system clock signal CLK.

For example, when the burst length corresponds to a full page, the memory device 71 sets the output terminal in the Hi-Z state in response to the rising edge of the next system clock signal CLK in accordance with a burst stop command (not shown) from the memory controller 72. Then, the memory device 71 completes the burst operation. When the burst length corresponds to pages other than the full page (e.g., 1, 2, 4, 8), an internal counter of the memory device 71 counts the number of bursts. After completing the burst operation, the memory device 71 sets the output terminal in a Hi-Z state in response to the rising edge of the next system clock signal CLK.

FIG. 5 is a timing chart illustrating an example of the Hi-Z control of the SDRAM when the burst length is "2". After the read command is provided, the I/O terminal exits the Hi-Z state of the I/O terminal after time tLZ elapses from when the system clock signal CLK goes high at time t1. Then, the output of the read data is held until time tOH elapses from when the system clock signal CLK goes high at time t2 (the output valid time is determined). The output of the read data is held until time tOH elapses from when the system clock signal CLK goes high at time t3. The I/O terminal enters the Hi-Z state after time tHZ elapses from time t3.

In the synchronous memory system, the Hi-Z state ends in response to the rising edge of the system clock signal CLK when the burst operation is started. Further, the Hi-Z control begins in response to the rising edge of the next system clock signal CLK after the burst operation ends. Accordingly, for an n number of burst operations, an (n+1) number of system clock signals CLK is used.

An synchronous memory device employing the EDO technique does not have an input terminal for the system clock signal CLK but has an input terminal for a control chip enable signal (not shown). The chip enable signal cannot be used for the Hi-Z control due to the following reason. The chip enable signal is generated by a memory controller. When data is received from a memory device, the chip enable signal goes high once and goes low only once. Accordingly, in the asynchronous memory, two chip enable signals cannot be generated for a single burst operation like in the synchronous memory. Thus, in an asynchronous memory system employing the EDO technique, an additional exclusive terminal for the I/O control signal OEB is necessary to perform the Hi-Z control.

SUMMARY OF THE INVENTION

One aspect of the present invention is an asynchronous semiconductor memory device including a memory unit, an output circuit for outputting data read from the memory unit, and an output control circuit connected to the output circuit for storing read completion information and comparing present read operation information with the read completion information. The output control circuit causes the output circuit to enter a disconnected state when the present read operation information substantially coincides with the read completion information.

A further aspect of the present invention is a method for controlling an output circuit that outputs data read from a memory unit of an asynchronous semiconductor memory. The method includes storing read completion information, comparing present read operation information with the read completion information, and causing the output circuit to enter a disconnected state when the present read operation information substantially coincides with the read completion information.

A further aspect of the present invention is a memory system including an asynchronous semiconductor memory device and a controller for controlling the semiconductor memory device. The controller provides data read completion information of data to the semiconductor memory device. The semiconductor memory device includes a memory unit, an output circuit for outputting data read from the memory unit, and an output control circuit connected to the output circuit for storing read completion information and comparing present read operation information with the read completion information. The output control circuit causes the output circuit to enter a disconnected state when the present read operation information substantially coincides with the read completion information.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 11 is a timing chart illustrating the operation of the flash memory of FIG. 7;

DETAILED DESCRIPTION OF THE PREFERRED EMBODIMENTS

Figure 1:
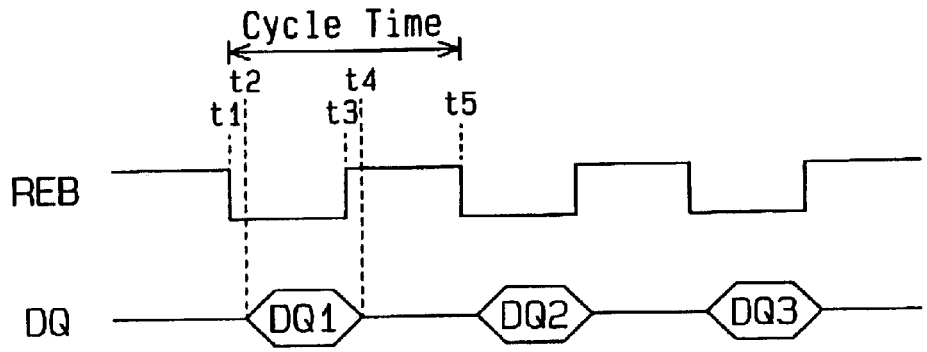
FIG. 1 is a timing chart illustrating high impedance control in a prior art asynchronous memory system.
Figure 2:
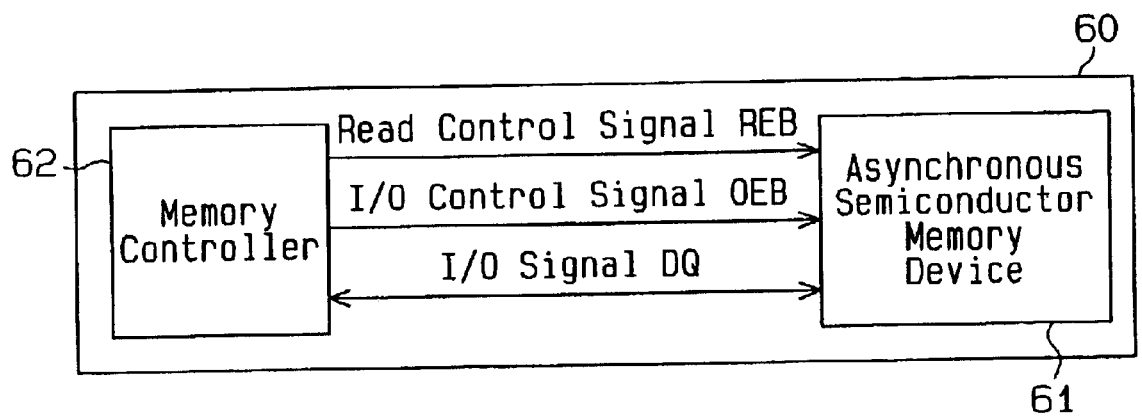
FIG. 2 is a schematic block diagram of a prior art EDO-DRAM.
Figure 3:
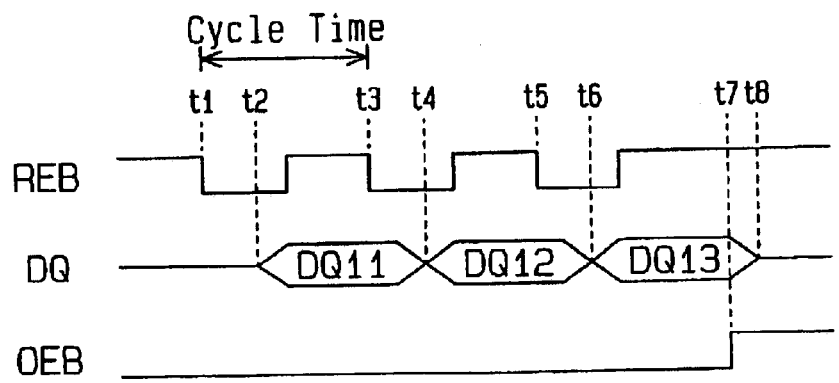
FIG. 3 is a timing chart illustrating high impedance control of the EDO-DRAM of FIG. 2.
Figure 4:
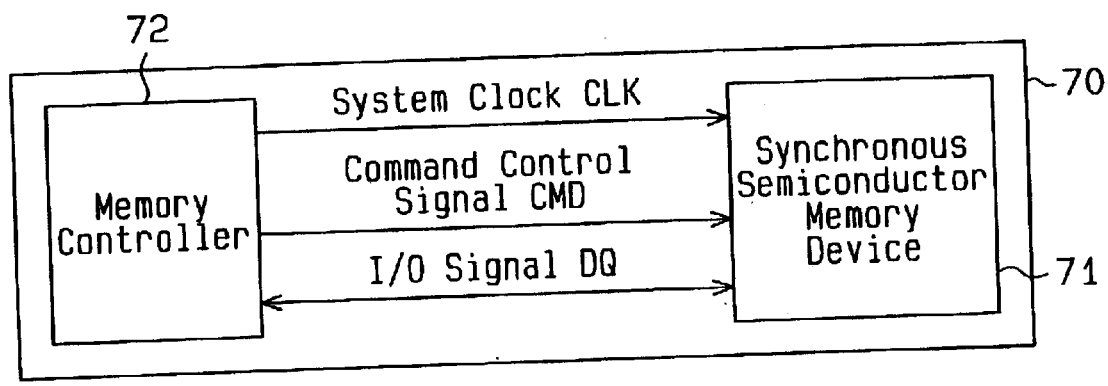
FIG. 4 is a schematic block diagram of a prior art synchronous memory system.
Figure 5:
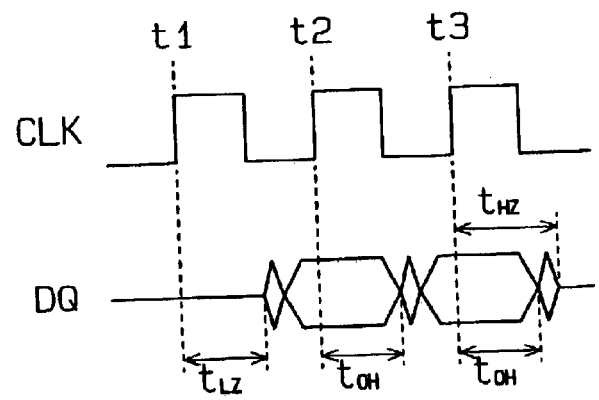
FIG. 5 is a timing chart illustrating high impedance control in the synchronous memory system of FIG. 4.
Figure 6:
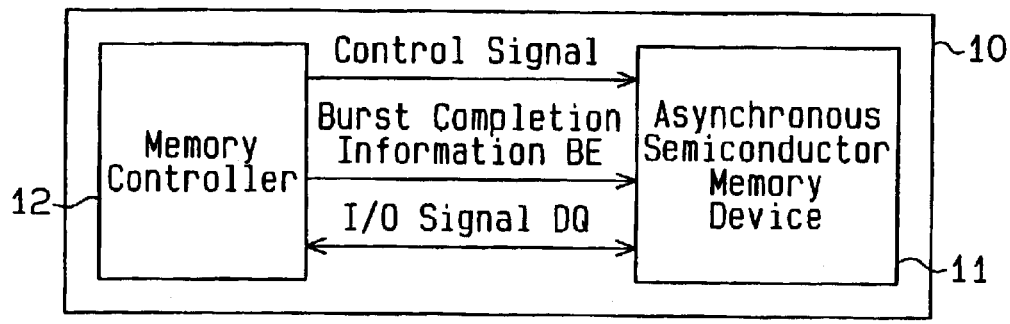
FIG. 6 is a schematic block diagram of an asynchronous memory system according to a first embodiment of the present invention.

In the drawings, like numerals are used for like elements throughout.

An asynchronous memory system 10 according to a first embodiment of the present invention will now be discussed with reference to FIGS. 6 to 11. The memory system 10 includes a memory device 11, which is an asynchronous semiconductor device, and a memory controller 12, such as a CPU (not shown), for controlling the memory device 11.

The memory device 11 is controlled by a variety of control signals CS from the memory controller 12. The memory controller 12 provides the memory device 11 with burst completion information BE when a data read operation is performed.

In the read operation, the memory device 11 receives various control signals CS and an I/O signal DQ (command or address) from the memory controller 12 and outputs read data.

Prior to the control signal CS for reading data (i.e., read control signal), the memory device 11 is provided with the burst completion information BE from the memory controller 12. The burst completion information BE includes information related to the time for completing the read operation of the memory device 11 (e.g., completion address). The output of the read data of the memory device 11 is controlled in a high impedance or a disconnected (hereinafter, referred to as Hi-Z) state in accordance with the burst completion information BE.

When the memory device 11 outputs read data of the final address indicated by the burst completion information BE (I/O signal DQ), the memory device 11 causes the data output terminal (I/O terminal) to enter the Hi-Z state (i.e., disconnects the data output terminal from an external device).

Figure 7:
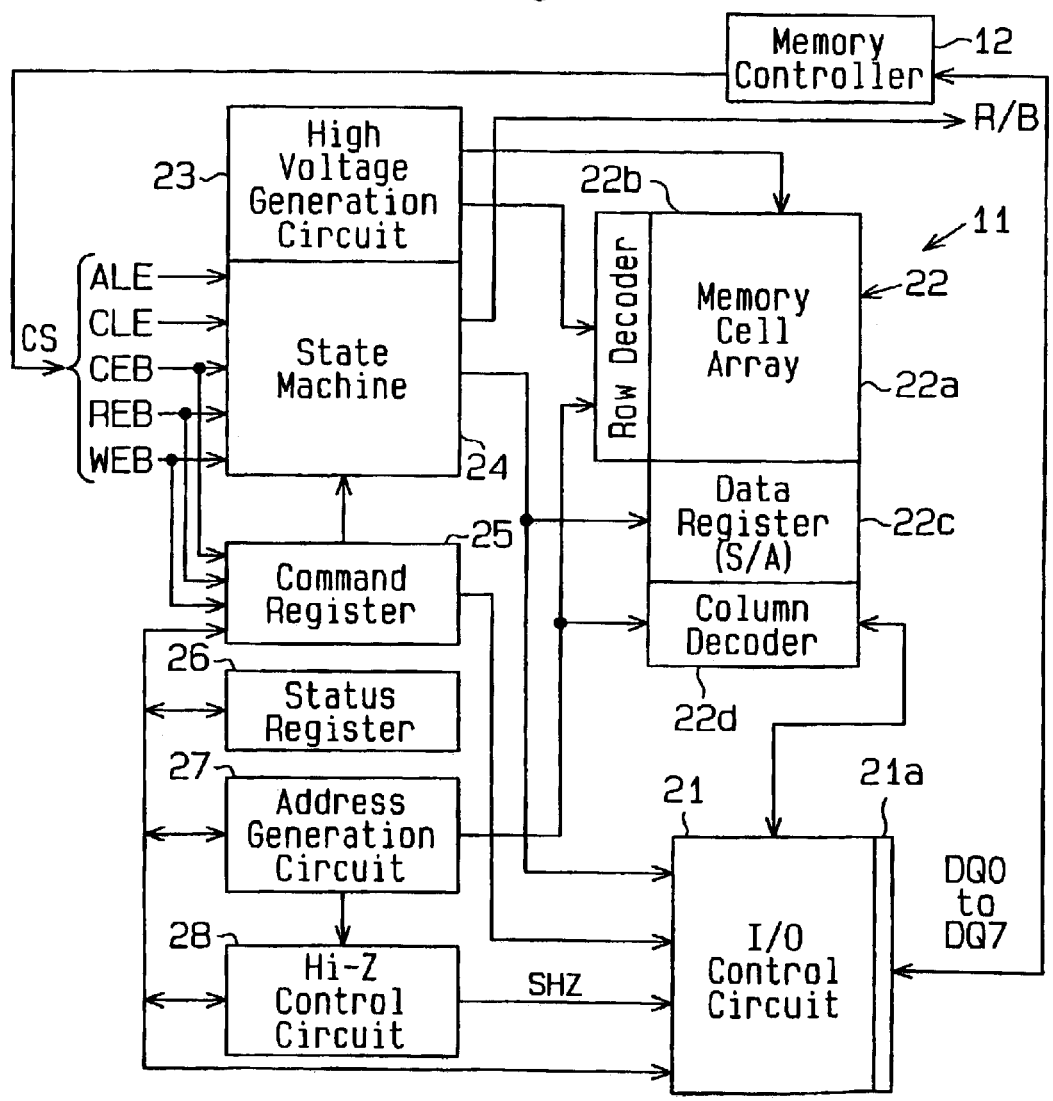
FIG. 7 is a schematic block diagram of a NAND flash memory in the memory system of FIG. 6.

As shown in FIG. 7, the memory device 11 is an asynchronous semiconductor memory device, or a NAND flash memory device. The memory device 11 is controlled by the memory controller 12.

The memory device 11 includes an I/O control circuit 21, which is an output circuit, a memory core 22, a high voltage generation circuit 23, a state machine 24, a command register 25, a status register 26, an address generation circuit 27, and a Hi-Z control circuit 28, which is an output control circuit.

The I/O control circuit 21 includes a plurality (in the first embodiment, eight pins) of I/O terminals 21a to receive I/O signals DQ0 to DQ7, which are address or data, from the memory controller 12. The I/O control circuit 21 provides the memory controller 12 with the I/O signals DQ0 to DQ7, which are read data, from the I/O terminals 21a.

The memory core 22 includes a memory cell array 22a, which is formed from a plurality of memory cells, a row decoder 22b, a data register 22c, and a column decoder 22d. When data is read from the memory cells, the row decoder 22b decodes a row address, selects (activates) a single word line, and outputs bit line data associated with the memory cells connected to the selected word line. The data register 22c includes a sense amplifier (S/A), which is connected to each bit line, amplifies the data read from the memory cells, and holds the data. The column decoder 22d decodes a column address and selects a bit line to provide the I/O control circuit with data held by a sense amplifier that is connected to the selected bit line.

The voltage generation circuit 23 is supplied with power supply voltage and generates high voltage, which is required to write and erase data in the memory cells of the memory cell array 22a. That is, the high voltage generated by the high voltage generation circuit 23 electrically rewrites the data stored in the memory cells.

The state machine 24 receives the various control signals CS from the memory controller 12. The control signals CS include an address latch enable signal ALE, a command latch enable signal CLE, a chip enable signal CEB, a read enable signal REB, and a write enable signal WEB.

The address latch enable signal ALE is used to determine whether the I/O signals DQ0 to DQ7, which are provided from the memory controller 12, are address or data, such as commands. When the address latch enable signal ALE is high, the memory device 11 latches the addresses (I/O signals DQ0 to DQ7). When the address latch enable signal ALE is low, the memory device 11 latches the input data (I/O signals DQ0 to DQ7).

The command latch enable signal CLE is used when writing the commands (DQ0 to DQ7), which are provided from the memory controller 12, to the command register 25. More specifically, the memory device 11 writes the I/O signals DQ0 to DQ7, or a command based on predetermined code information, to the command register 25 when the write enable signal WEB goes high in response to a high command latch enable signal CLE.

The chip enable signal CEB is used to select the memory device 11 itself. When the chip enable signal CEB is low, the memory device 11 is selected. When the chip enable signal CEB is high, the memory device 11 enters a standby (non-selected) state.

The read enable signal REB is used to control the output of data from the I/O control circuit 21. In response to the trailing edge of the read enable signal REB, the I/O control circuit 21 outputs the I/O signals DQ0 to DQ7 in a serial manner. The read enable signal REB uses an internal address counter (not shown) of the address generation circuit 27 as a counter clock signal.

The write enable signal WEB is used to control the input signals (address or command) from the memory controller 12. In response to the rising edge of the write enables signal WEB, the memory device 11 receives the I/O signals DQ0 to DQ7.

The state machine 24 receives various types of control signals, recognizes the internal operation state of the memory device 11, and provides a ready/busy signal R/B in accordance with the operation state to an external device (not shown). More specifically, when the memory device 11 is operating, the state machine 24 generates the ready/busy signal R/B at a low level, which represents a busy state. Internal operations of the memory device 11 include, for example, a data erase operation and a read operation, which is performed from when an address is designated to when initial data is read.

The command register 25 receives the I/O signals DQ0 to DQ7 from the memory controller 12 and generates various types of commands, which are used to control the operation of the memory device 11, based on predetermined code information. The commands include, for example, a data write command, a data read command, and a data erase command.

The status register 26 determines the operating state of the memory device 11 and outputs a signal, which represents the operating state, to the I/O control circuit 21. For example, the status register 26 determines whether the memory device 11 is in a ready state or a busy state (i.e., whether internal operation is completed) or whether the writing and erasing of data has been performed normally and outputs a signal, which indicates the determination result.

The address generation circuit 27 receives the I/O signals DQ0 to DW7 from the memory controller 12, or the address of the data at which reading is started during the read operation, provides the row address of the starting address to the row decoder 22b, and provides the column address of the starting address to the column decoder 22d.

The address generation circuit 27 includes an internal address counter that receives the read enables signal REB via the command register 25 during the read operation and performs a count up operation in response to a toggle (clock pulse) of the read enable signal REB. Due to the count up operation, the address generation circuit 27 sequentially generates addresses based on the starting address (more specifically, increments the column address) and provides the generated address to the column decoder 22d and the Hi-Z control circuit 28. Accordingly, data is read sequentially from the starting address. The reading operation is a burst read operation.

The Hi-Z control circuit 28 receives burst completion information BE, which is the address (I/O signals DQ0 to DQ7) of the data at which reading is completed during the read operation, from the memory controller 12.

The Hi-Z control circuit 28 compares the completion address with generated address, which is provided from the address generation circuit 27. When the two addresses coincide with each other, the Hi-Z control circuit 28 provides a Hi-Z control signal SHZ, which is an output control signal, to the I/O control circuit 21. That is, the Hi-Z control circuit 28 generates the Hi-Z control signal SHZ so that the I/O terminal 21a of the I/O control circuit 21 enters the Hi-Z state when the address sequentially generated during the burst operation (burst operation information) coincides with the predetermined completion address (burst completion information).

When the generated address and the completion address coincide with each other, the Hi-Z control circuit 28 generates the Hi-Z control signal SHZ after a predetermined time elapses from when the read enable signal REB goes low. The period until the Hi-Z control signal SHZ is provided to the I/O control circuit 21 is set so that the output valid time of the final read data is sufficiently guaranteed. In other words, the I/O terminal 21a enters the Hi-Z state after the output valid time of the final read data is sufficiently guaranteed.

Figure 8:
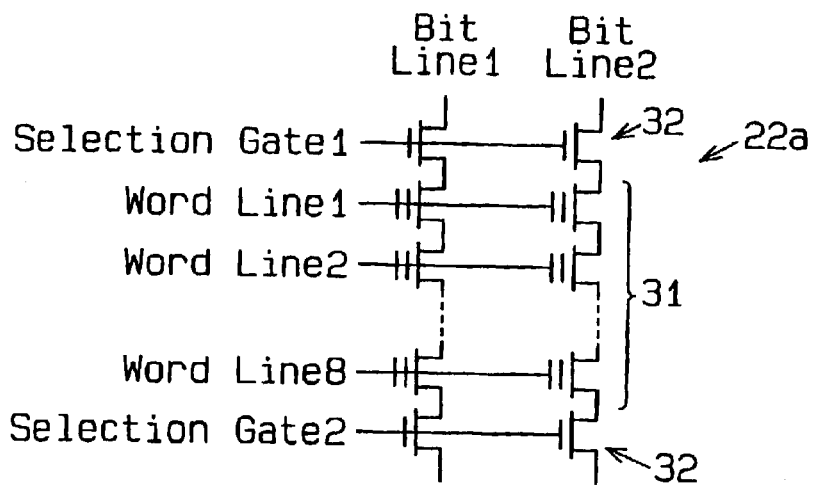
FIG. 8 is a schematic circuit diagram of a memory cell array of the flash memory of FIG. 7.

With reference to FIG. 8, the memory cell array 22a of the NAND flash memory includes memory cell (memory transistor) groups 31, each having 8 bits or 16 bits (8 bits in FIG. 8), and two selection cells (selection transistors) 32, which are connected to each memory cell group 31.

Electrons are injected into the floating gate of a memory cell to write data by applying 0V to the source and applying a high voltage to the drain and the control gate. The electrons are discharged from the floating gate of the memory cell to erase data by applying 0V to the control gate and applying a high voltage to the source (or drain).

Figure 9:
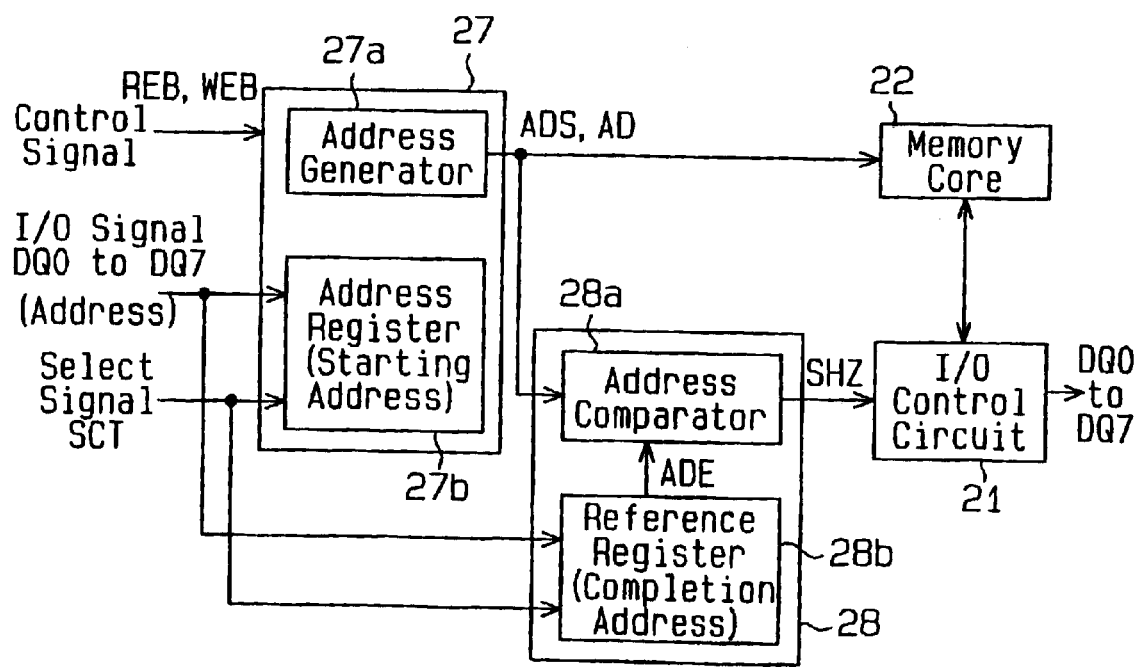
FIG. 9 is a schematic block diagram of an address generation circuit and a high impedance control circuit in the flash memory of FIG. 7.

As shown in FIG. 9, the address generation circuit 27 includes an address generator 27a and an address register 27b. The address register 27b receives the I/O signals DQ0 to DQ7, which are provided from the memory controller 12, or a starting address ADS of the read data, in response to the rising edge of the write enable signal WEB based on the select signal SCT. The select signal SCT instructs the starting address ADS that corresponds to each type of read mode, which is set by a command during the read operation. In other words, the select signal SCT is used to determine whether the starting address ADS is provided or a completion address ADE is provided.

The address generator 27a includes an internal address counter, which performs a count up operation in response to the toggle (clock pulse) of the read enable signal REB. The address generator 27a increments the starting address ADS (column address) based on the count value to sequentially generate the address AD. The generated address AD is provided to the memory core 22 and the Hi-Z control circuit 28.

The Hi-Z control circuit 28 includes an address comparator 28a and a reference register 28b. The reference register 28b receives the I/O signals DQ0 to DQ7, which are provided from the memory controller 12 based on the select signal SCT, which are provided from the command register 25. That is, the reference register 28b receives the completion address ADE of the read data.

The address comparator 28a receives the generated address AD from the address generator 27a and receives the completion address ADE from the reference register 28b. The address comparator 28a compares the completion address ADE and the generated address AD. When the two addresses coincide with each other, the address comparator 28a generates the Hi-Z control signal SHZ. In response to the Hi-Z control signal SHZ provided from the address comparator 28a, the I/O control circuit 21 causes the I/O terminal 21a to enter the Hi-Z state.

The Hi-Z control during the read operation will now be discussed with reference to the timing chart of FIGS. 10(a) and 10(b).

Figure 10A:
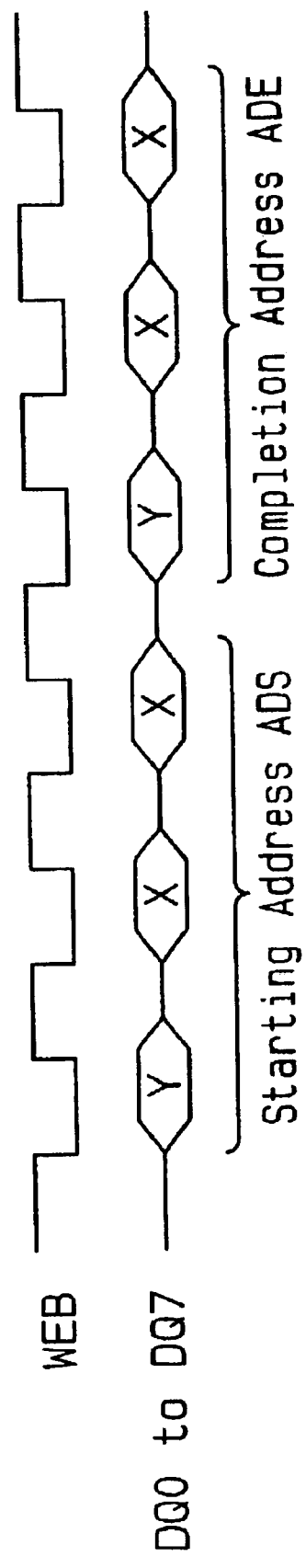
FIG. 10(a) is a timing chart illustrating high impedance control performed by the address generation circuit and the high impedance control circuit of FIG. 9.

Referring to FIG. 10(a), after a command for reading data is provided, the starting address ADS of the read data is provided to the memory device 11 in three cycles in response to the rising edge of the write enable signal WEB. More specifically, in the first cycle, the I/O signals DQ0 to DQ7, or a column address Y of the starting address ADS, is retrieved. The I/O signals DQ0 to DQ7, or the page address (row address) X, is retrieved in the second and third cycles.

Then, after the starting address ADS is provided, the completion address ADE is provided to the memory device 11 in three cycles in response to the rising edge of the write enable signal WEB. More specifically, in the fourth cycle, the I/O signals DQ0 to DQ7, or a column address Y of the completion address ADE, are retrieved. The I/O signals DQ0 to DQ7, or the page address (row address) X of the completion address ADE, is retrieved in the fifth and sixth cycles.

During such read operation, the starting address ADS is provided during the first three cycles subsequent to the input of a command, and the completion address ADE is provided in the final three cycles.

Figure 10B:
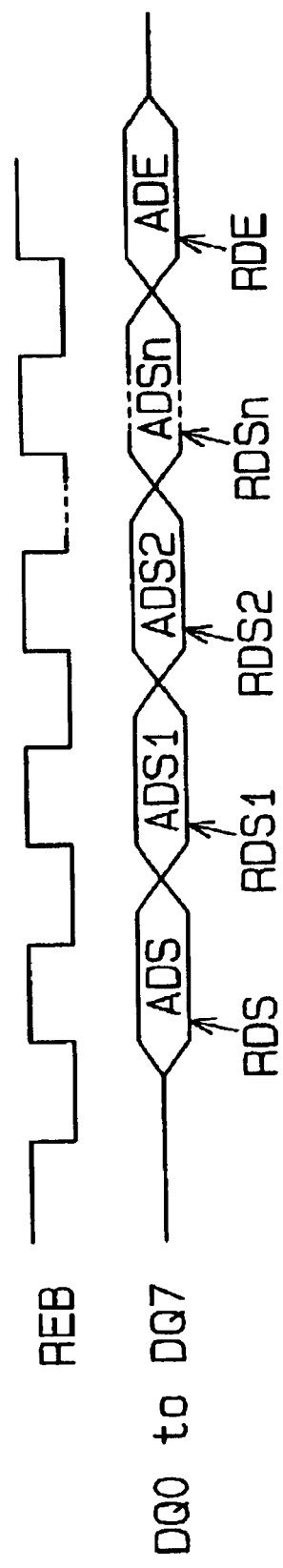
FIG. 10(b) is a timing chart illustrating data burst reading performed by the flash memory of FIG. 7.

Referring to FIG. 10(b), after the completion address ADE is provided, read data RDS corresponding to the starting address ADS is output from the memory device 11 in response to the first trailing edge of the read enable signal REB.

The address generation circuit 27 increments the column address of the starting address ADS in response to the toggle of the read enable signal REB and generates addresses ADS1, ADS2, . . . , ADSn. In accordance with these addresses, the address generation circuit 27 sequentially outputs read data RDS1, RDS2, . . . , RDSn.

In such burst read operation, the Hi-Z control circuit 28 sequentially compares the completion address ADE with the generated addresses ADS1, ADS2, . . . , ADSn. When the generated address coincides with the completion address ADE, the Hi-Z control circuit 28 generates the Hi-Z control circuit SHZ after a predetermined time elapses from when the read enable signal REB goes low. That is, after the output valid time is secured from when the final read data RDE is output during the burst read operation, the Hi-Z control circuit 28 generates the Hi-Z control signal SHZ. The I/O control circuit 21 causes the I/O terminal 21a to enter the Hi-Z state in response to the Hi-Z control signal SHZ.

FIG. 11 is a timing chart illustrating the read operation. The memory device 11 is activated (selected) when the chip enable signal CEB goes low to cause the I/O terminal 21a of the control signal SHZ to enter the Hi-Z state.

In response to a high level of a command latch enable signal CLE and the rising edge of the write enable signal WEB, the memory device 11 receives the I/O signals DQ0 to DQ7 as the data read command. Then, the memory device 11 receives the I/O signals DQ0 to DQ7 as the starting address in three cycles in response to a high level of an address latch enable signal ALE and the rising edge of the write enable signal WEB. The memory device 11 further receives the I/O signals DQ0 to DQ7 as the completion address in three cycles.

When the completion address is provided, the data corresponding to the starting address is read from the memory cells of the memory device 11 and transferred to the data register 22c. In this state, the memory device 11 provides the ready/busy signal R/B at a low level, which represents a busy state, to an external device.

When the transfer of data is completed, the ready/busy signals R/B goes high, and the memory device 11 sequentially outputs data (I/O signals DQ0 to DQ7) corresponding to the addresses subsequent to the starting address in response to the trailing edge of the read enable signal REB. The reading of the data is performed in a sequential manner until data corresponding to a predetermined completion address is output (FIG. 11 shows an example in which four cycles of the read data is output). That is, the burst operation is performed until the data corresponding to the completion address is read.

The Hi-Z control circuit 28 generates the Hi-Z control signal SHZ after a predetermined time elapses from when the address of the final read data is determined as being the completion address. The I/O control circuit 21 causes the I/O terminal 21a to enter the Hi-Z state in response to the Hi-Z control signal. In this manner, the I/O terminal 21a automatically enters the Hi-Z state after completion of the burst read.

The memory system 10 of the first embodiment has the advantages described below.

(1) The asynchronous memory device 11 receives the starting address ADS and the completion address ADE after the input of a command during the read operation. In response to the read enable signal REB, the address generation circuit 27 sequentially generates the address AD subsequent to the starting address ADS. The address comparator 28a of the Hi-Z control circuit 28 compares the generated address AD with the completion address ADE. When the addresses AD, ADE coincide with each other, the Hi-Z control circuit 28 provides the I/O control circuit 21 with the Hi-Z control signal SHZ. As a result, the I/O terminal 21a enters the Hi-Z state. Accordingly, Hi-Z control is performed without having to provide an exclusive terminal in the asynchronous memory system 10 employing the EDO technique. In other words, the EDO memory system 10 guarantees the data output valid time during high frequency operation without using an exclusive terminal. This increases the speed of the entire memory system.

(2) Since an exclusive terminal is not required for Hi-Z control, the chip size remains compact.

(3) An I/O control signal OEB for Hi-Z control is not necessary like in the prior art EDO DRAM. Thus, the number of control signals is not increased. Further, the influence on other user circuits on the chip or the entire memory system is minimized.

Figure 12:
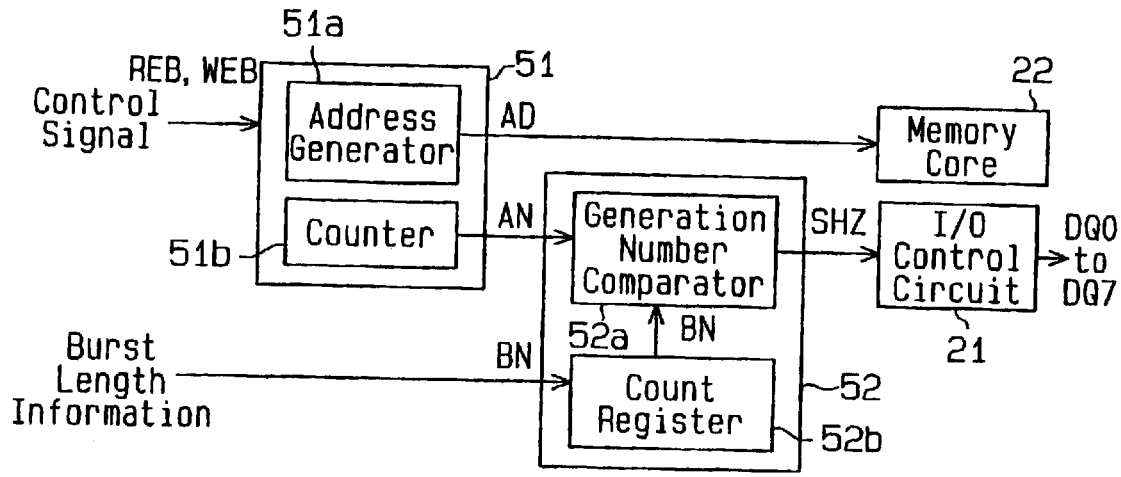
FIG. 12 is a schematic block diagram of an address generation circuit and a high impedance control circuit in a flash memory of an asynchronous memory system according to a second embodiment of the present invention.

FIG. 12 is a schematic block diagram of an address generation circuit 51 and a Hi-Z control circuit 52 of a memory system according to a second embodiment of the present invention.

The address generation circuit 51 includes an address generator 51a and a counter 51b, which is an address generation counting device. In response to the rising edge of a write enable signal WEB provided from a command register 25, the address generator 51a receives the I/O signals DQ0 to DQ7 as the starting address ADS. In response to the toggle of the read enable signal REB provided from the command register 25, the address generator 51a increments the column address of the starting address ADS and sequentially generates addresses AD. The generated addresses AD are provided to a memory core 22. The counter 51b counts the number of times the address generator 51a generates the address AD and provides the generation number information AN to the Hi-Z control circuit 52.

The Hi-Z control circuit 52 includes a generation number comparator 52a and a count register 52b. The count register 52b receives burst length information (burst completion information) BN, which indicates the number of times data is read, from the memory controller 12. The burst length information BN is set by the I/O signals DQ0 to DQ7.

The generation number comparator 52a compares the read number of the burst length information BN with generation number information AN, which is provided from the counter 51b. When the two pieces of information coincide with each other, the generation number comparator 52a provides the Hi-Z control signal SHZ to the I/O control circuit 21. That is, the generation number comparator 52a generates the Hi-Z control signal SHZ when the generation number of the generated addresses AD (burst operation information) coincides with the predetermined burst length information BN (burst completion information).

The generation number comparator 52a generates the Hi-Z control signal SHZ after the guaranteed output valid time of the final read data elapses from when detecting the generation number of the addresses AD coinciding with the designated read number on the burst length information BN. The I/O control circuit 21 causes the I/O terminal 21a to enter the Hi-Z state in response to the Hi-Z control signal SHZ.

Figure 13:
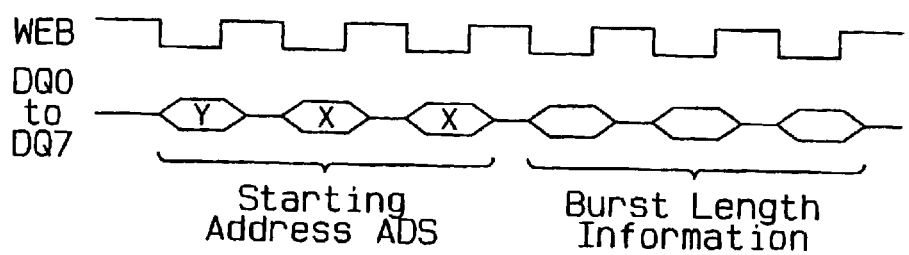
FIG. 13 is a timing chart illustrating high impedance control performed by the address generation circuit and the high impedance control circuit of FIG. 12.

FIG. 13 is a timing chart illustrating Hi-Z control when the read operation is performed in the second embodiment. After the data read command is provided, the starting address ADS of the read data is provided to the memory device 11 in three cycles in response to the rising edge of the write enable signal WEB. More specifically, the I/O signals DQ0 to DQ7, or the column address Y of the starting address ADS, is retrieved in the first cycle, and the I/O signals DQ0 to DQ7, or the page address (row address) X of the starting address ADS, is retrieved in the second and third cycles.

After the starting address ADS is provided, the burst length information BN is provided to the memory device 11 in response to the rising edge of the write enable signal in three cycles.

After the burst length information BN is provided, as shown in FIG. 10(b), the read data RDS corresponding to the starting address ADS is read in response to the first trailing edge of the read enable signal. Then, data is read in a sequential manner by the toggle of the read enable signal REB.

In such burst read operation, the Hi-Z control circuit 52 compares the predetermined burst length information BN with the generation number information AN from the counter 51b. When the two pieces of information coincide with each other, the Hi-Z control circuit 52 generates the Hi-Z control signal SHZ. That is, the Hi-Z control circuit 52 generates the Hi-Z control signal SHZ after the final read data is read during the burst read operation. The I/O control circuit 21 causes the I/O terminal 21a to enter the Hi-Z state in response to the Hi-Z control signal SHZ.

It should be apparent to those skilled in the art that the present invention may be embodied in many other specific forms without departing from the spirit or scope of the invention. Particularly, it should be understood that the present invention may be embodied in the following forms.

In addition to the NAND flash memory, the present invention may be applied to a non-volatile memory, such as a NOR flash memory, or an expansion data output type memory device, such as an EDO-DRAM.

The input cycle of the starting address ADS is not limited to three cycles. The input cycle may be varied in accordance with the number of I/O terminals 21a of the memory device 11. The input cycles of the completions address ADE and the burst length information BN are also not limited to three cycles and may be varied in accordance with the number of I/O terminals 21a.

In the first embodiment, the select signal SCT is not necessarily required when the starting address ADS received in the address generation circuit 27 is constant (e.g., when the pointer of a memory during burst access is constant).

In the first embodiment, the completion address ADE may be set as certain code information (e.g., special numeric values, such as address values, that exceed the memory capacity). In this case, the number of times data is read during the read operation may be set infinitely. In the second embodiment, the burst length information may be specific code information (e.g., special numeric values, such as "0"). In this case, the number of the read data may be set infinitely in the same manner. The number of read data being infinite indicates that the burst length (i.e., the number of times data is read) is infinite. More specifically, after the read enable signal REB is provided, the column address of a starting address is incremented until the column address of a starting address reaches the final column address of a page address (row address). When data is read up to the final column address, the page address is automatically incremented. Subsequently, the column address is incremented in the same manner and data is read successively. Due to the repetition of such operation by the address generation circuits 27, 51, the read operation is performed infinitely. To complete the burst read operation, for example, a chip enable signal CEB may be used.

In the second embodiment, when the setting of the burst length information BN is not changed, the count register 52b of the Hi-Z control circuit 52 may be replaced by a non-volatile device, such as a programmable ROM (PROM), which stores predetermined burst length information. In this case, in the manner illustrated in FIG. 14, the burst length information BN is set just once before the read operation is performed. When using a non-volatile memory device, power supply control of an asynchronous semiconductor memory device may be performed between the cycle in which the burst length information BN is performed and the cycle in which the read operation is performed for a predetermined number of times. For example, the supply of power is temporarily stopped after the cycle in which the burst length information BN is set. Then, the power goes on and the read operation is performed. In this case, the read operation is started without setting the burst length information BN. In this structure, the setting of the burst length information BN during the read operation is not necessary. This reduces the influence of the burst length setting over the memory system 10.

Further, the non-volatile memory device, which stores the burst length information BN, may be arranged outside the asynchronous semiconductor memory device. When the count register 52b functions as a volatile memory device, a further non-volatile memory device, which provides the burst length information BN to the volatile memory device (the count register 52b), may be arranged inside or outside the asynchronous semiconductor memory device.

Figure 14:
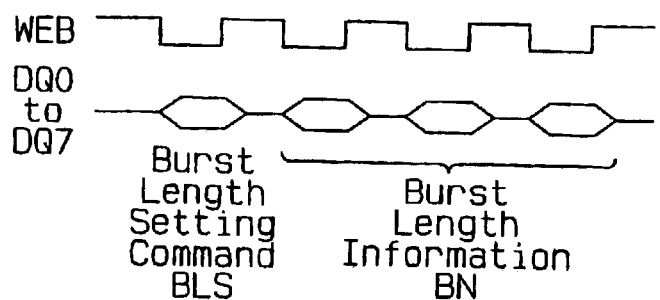
FIG. 14 is a timing chart illustrating a modified example for setting burst length information.

In the second embodiment, the burst length information BN may be set using a command. As shown in FIG. 14, prior to a data read command (not shown) in the read operation, the I/O signals DQ0 to DQ7, or the burst length setting command BLS, is provided from the memory controller 12. The burst length information BN is received by the count register 52b a predetermined number of times (e.g., three cycles) in accordance with the burst length setting command BLS. The burst length setting command BLS is represented by predetermined code information (burst length setting code), which is based on the I/O signals DQ0 to DQ7, and set in the command register 25.

In this modification, the burst length information BN is set at least before the output of the read data in the first burst operation. Accordingly, after the burst length information BN is set, only the starting address ADS is required to be designated. In this modification, the setting of the burst length information BN may be changed when required by the burst length setting command BLS.

The present examples and embodiments are to be considered as illustrative and not restrictive, and the invention is not to be limited to the details given herein, but may be modified within the scope and equivalence of the appended claims.

What is claimed is:

1. An asynchronous semiconductor memory device comprising:
   a memory unit;
   an output circuit for outputting data read from the memory unit; and
   an output control circuit connected to the output circuit for storing read completion information and comparing present read operation information with the read completion information, wherein the output control circuit causes the output circuit to enter a disconnected state when the present read operation information substantially coincides with the read completion information.

2. The device according to claim 1, further comprising an address generation circuit connected to the memory unit and the output control circuit to sequentially generate an address from a starting address of the read data in accordance with a read control signal and to provide the output control circuit with the generated address as the present read operation information.

3. The device according to claim 2, wherein the read completion information is a completion address of the read data, and the output control circuit compares the completion address with the generated address.

4. The device according to claim 3, wherein the output control circuit includes a register for storing the completion address.

5. The device according to claim 1, further comprising an address generation circuit connected to the memory unit and the output control circuit to sequentially generate an address from a starting address of the read data in accordance with a read control signal and count the generated number of the address, wherein the address generation circuit provides the output control circuit with a count value as the present read operation information.

6. The device according to claim 5, wherein the read completion information is a predetermined read number, and the output control circuit compares the predetermined read number with the count value.

7. The device according to claim 6, wherein the output control circuit includes a register for storing a predetermined read number.

8. The device according to claim 1, wherein the output control circuit includes a comparator for comparing the present read operation information and the read completion information, the comparator causing the output circuit to enter the disconnected state after validating the output of final read data when the present read information substantially coincides with the read completion information.

9. The device according to claim 8, wherein the read completion information is a completion address of the read data, the device further comprising an address generation circuit connected to the memory unit and the comparator to sequentially generate an address from a starting address of the read data in accordance with a read control signal and to provide the comparator with the generated address as the present read operation information.

10. The device according to claim 8, wherein the read completion information is a predetermined read number, the device further comprising an address generation circuit connected to the memory unit and the comparator to sequentially generate an address from a starting address of the read data in accordance with a read control signal and count the generated number of the address, wherein the address generation circuit provides the output control circuit with a count value as the present read operation information.

11. The device according to claim 1, wherein the read completion information includes infinite read information of the data.

12. The device according to claim 1, wherein the read completion information includes burst read completion information, and the output control circuit stores burst read completion information in accordance with a burst length setting command.

13. The device according to claim 1, wherein the memory unit stores read completion information.

14. The device according to claim 1, wherein the device is a NAND flash memory device.

15. A method for controlling an output circuit that outputs data read from a memory unit of an asynchronous semiconductor memory, the method comprising the steps of:
   storing read completion information;
   comparing present read operation information with the read completion information; and
   causing the output circuit to enter a disconnected state when the present read operation information substantially coincides with the read completion information.

16. The method according to claim 15, wherein the read completion information is a completion address of the read data, the method further comprising the steps of:
   sequentially generating an address from a starting address of the read data in accordance with a read control signal;
   wherein the comparing step includes comparing a presently generated address with the completion address.

17. The method according to claim 16 further comprising the step of receiving the completion address before or after the starting address.

18. The method according to claim 16, wherein the step for storing the read completion information includes storing the completion address at least before the first read operation is started based on the starting address.

19. The method according to claim 15, wherein the read completion information is a predetermined read number, the method further comprising the steps of:
   sequentially generating an address from the starting address of the read data in accordance with a read control signal; and
   counting the generated number of the address;
   wherein the comparing step includes comparing a count value of the generated number of the address with the predetermined read number.

20. The method according to claim 19, further comprising the step of receiving the predetermined read number before or after the starting address.

21. The method according to claim 19, wherein the step for storing the read completion information includes storing the predetermined read number at least before the first read operation is started based on the starting address.

22. The method according to claim 15, wherein the read completion information includes infinite read information of the data.

23. The method according to claim 15, wherein the step for storing the read information includes storing the read completion information in the memory unit.

24. A memory system comprising:
   an asynchronous semiconductor memory device; and
   a controller for controlling the semiconductor memory device, wherein the controller provides data read completion information of data to the semiconductor memory device, the semiconductor memory device including;
   a memory unit;
   an output circuit for outputting data read from the memory unit; and
   an output control circuit connected to the output circuit for storing read completion information and comparing present read operation information with the read completion information, wherein the output control circuit causes the output circuit to enter a disconnected state when the present read operation information substantially coincides with the read completion information.

25. The system according to claim 24, wherein the read completion information is a completion address of the read data, the semiconductor memory device further comprising:
   an address generation circuit for receiving the starting address of the read data and sequentially generating an address from the starting address in accordance with the read control signal;
   wherein the output control circuit includes a comparator for comparing the generated address with the completion address, the comparator causing the output circuit to enter the disconnected state when the generated address substantially coincides with the completion address.

26. The system according to claim 25, wherein the comparator causes the output circuit to enter the disconnected state after validating the output of a final read data when a presently generated address substantially coincides with the completion address.

27. The system according to claim 25, wherein the output control circuit receives the completion address before or after the address generation circuit receives the completion address.

28. The system according to claim 25, wherein the output control circuit stores the completion address at least before the first read operation is started based on the starting address.

29. The system according to claim 24, wherein the read completion information is a predetermined read number of the read data, the semiconductor memory device further including:

an address generation circuit for receiving the starting address of the read data and sequentially generating an address from the starting address in accordance with the read control signal, wherein the address generation circuit counts the generated number of the address, and the output control circuit has a comparator for comparing the generated number of the address with the predetermined read number, the comparator causing the output circuit to enter the disconnected state when the generated number of the address substantially coincides with the predetermined read number.

30. The system according to claim 29, wherein the comparator causes the output circuit to enter the disconnected state after validating the output of a final read data when the generated number of the address substantially coincides with the predetermined read number.

31. The system according to claim 29, wherein the output control circuit receives the predetermined read number before or after the address generation circuit receives the starting address.

32. The system according to claim 29, wherein the output control circuit stores the predetermined read number at least before the first read operation is started based on the starting address.

33. The system according to claim 24, wherein the read completion information includes infinite read information of the data.

\* \* \* \* \*